United States Patent

Hidaka

(10) Patent No.: US 9,887,548 B2
(45) Date of Patent: Feb. 6, 2018

(54) POWER MANAGEMENT APPARATUS AND POWER MANAGEMENT METHOD

(71) Applicant: KYOCERA CORPORATION, Kyoto (JP)

(72) Inventor: Hiroyuki Hidaka, Kawasaki (JP)

(73) Assignee: KYOCERA CORPORATION, Kyoto (JP)

(*) Notice: Subject to any disclaimer, the term of this patent is extended or adjusted under 35 U.S.C. 154(b) by 459 days.

(21) Appl. No.: 14/410,216

(22) PCT Filed: Jul. 9, 2013

(86) PCT No.: PCT/JP2013/068790
§ 371 (c)(1),
(2) Date: Dec. 22, 2014

(87) PCT Pub. No.: WO2014/010610
PCT Pub. Date: Jan. 16, 2014

(65) Prior Publication Data
US 2015/0326018 A1 Nov. 12, 2015

(30) Foreign Application Priority Data
Jul. 9, 2012 (JP) ................ 2012-153830

(51) Int. Cl.
H02J 3/00 (2006.01)
H02J 3/14 (2006.01)
H02J 3/32 (2006.01)
H02J 3/38 (2006.01)
G01R 21/00 (2006.01)

(52) U.S. Cl.
CPC .............. *H02J 3/32* (2013.01); *G01R 21/00* (2013.01); *G01R 21/001* (2013.01); *H02J 3/14* (2013.01); *H02J 3/383* (2013.01); *H02J 3/387* (2013.01); *H02J 2003/143* (2013.01); *H02J 2003/146* (2013.01); *Y02B 70/3225* (2013.01); *Y02B 70/3266* (2013.01); *Y02E 10/563* (2013.01); *Y02E 10/566* (2013.01); *Y02E 70/30* (2013.01); *Y04S 20/222* (2013.01); *Y04S 20/224* (2013.01); *Y04S 20/242* (2013.01); *Y10T 307/352* (2015.04)

(58) Field of Classification Search
USPC .................................................. 307/35, 31
See application file for complete search history.

(56) References Cited

FOREIGN PATENT DOCUMENTS

| JP | H10-198875 A | 7/1998 |
|---|---|---|
| JP | 2000-184590 A | 6/2000 |
| JP | 2010-187469 A | 8/2010 |

OTHER PUBLICATIONS

Extended European Search Report dated Feb. 11, 2016 issued by the European Patent Office for EPC Application No. 13817478.4.
International Search Report; PCT/JP2013/068790; dated Sep. 24, 2013.

*Primary Examiner* — Rexford Barnie
*Assistant Examiner* — Dru Parries
(74) *Attorney, Agent, or Firm* — Procopio Cory Hargreaves and Savitch LLP

(57) ABSTRACT

A power management apparatus (EMS 200) activates an acquisition function when it is determined at each time point in a predetermined period that an integral power consumption exceeds a predetermined power consumption.

8 Claims, 12 Drawing Sheets

POWER MANAGEMENT APPARATUS AND POWER MANAGEMENT METHOD

TECHNICAL FIELD

The present invention relates to a power management apparatus which controls so that an integral power consumption supplied from a grid in a predetermined period does not exceed a predetermined power consumption, and relates also to a power management method therefor.

BACKGROUND ART

Recently, there has been a raised awareness of environmental concern, and a technology is proposed for restraining an amount of power consumption of a load.

Although greatly depending on the electric power circumstance in each country, a total electric power rate of a high-voltage receiver in Japan is determined by a basic rate and a power consumption rate, for example. The basic rate is determined, for example, on the basis of an integral power consumption (peak power demand) supplied from a grid in a predetermined period (for example, 30 minutes) in the past. On the other hand, the power consumption rate is determined on the basis of an amount of power to be consumed in a calculation target period. Therefore, it is preferable to control the amount of power consumption of each load so that the integral power consumption does not exceed a predetermined power consumption.

In this case, a technology is proposed which presents to a user an alarm indicating that the amount of power consumption should be restrained so that an integral power consumption of power supplied from a grid in a predetermined period does not exceed a predetermined power consumption. Specifically, on the basis of an amount of power supplied from a grid that increases for each unit time (hereinafter, a unit-time increased amount), an integral power consumption at the expiration timing of a predetermined period is predicted, and when the predicted integral power consumption exceeds a predetermined power consumption, an alarm indicating that the amount of power consumption should be restrained is presented to a user (for example, Patent Literature 1).

In the above-described technology, in order to acquire a breakdown of the integral power consumption, it may be considered to acquire amounts of power consumption of a plurality of loads connected to a grid. When the breakdown of the integral power consumption is acquired, it becomes possible to control the load so that the integral power consumption at the expiration timing of a predetermined period does not exceed a predetermined power consumption.

In such a case, it is necessary to acquire the amount of power consumption of a plurality of loads in a predetermined interval. Here, when a predetermined interval is shorter, a frequency of acquiring an amount of power consumption of a load increases, and power consumption necessary to acquire an amount of power consumption of a load (measure and report an amount of power consumption of a load) increases. On the other hand, when a predetermined interval is longer, the power consumption necessary to acquire an amount of power consumption of a load (measure and report an amount of power consumption of a load) decreases, and the frequency of acquiring the amount of power consumption of a load decreases.

CITATION LIST

Patent Literature

Patent Literature 1: Japanese Patent Application Publication No. Heisei10-198875

SUMMARY OF INVENTION

A power management apparatus according to a first feature is for performing a control so that an integral power consumption supplied from a grid in a predetermined period does not exceed a predetermined power consumption. The power management apparatus includes a control unit which controls a function of acquiring an amount of power consumption of a load connected to the grid, in the predetermined period. The control unit activates the acquisition function when it is determined at each time point in the predetermined period that the integral power consumption exceeds a predetermined power consumption.

In the first feature, the control unit deactivates the acquisition function when it is determined at each time point in the predetermined period that the integral power consumption falls below the predetermined power consumption.

In the first feature, the activation of the acquisition function is one of an operation of starting acquiring the amount of power consumption of a load connected to the grid and an operation of shortening an interval of acquiring the amount of power consumption of a load connected to the grid.

In the first feature, the deactivation of the acquisition function is one of an operation of stopping acquiring the amount of power consumption of a load connected to the grid and an operation of extending the interval of acquiring the amount of power consumption of a load connected to the grid.

In the first feature, the control unit activates the acquisition function after a predetermined timing in the predetermined period.

In the first feature, the control unit activates the acquisition function, for a load having an amount of power consumption that has a ratio relative to the integral power consumption exceeding a predetermined ratio, out of a plurality of loads.

A power management method according to a second feature is a method for performing a control so that an integral power consumption supplied from a grid in a predetermined period does not exceed a predetermined power consumption. The power management method includes a control step of controlling a function of acquiring an amount of power consumption of a load connected to the grid, in the predetermined period. The control step includes a step of activating the acquisition function when it is determined at each time point in the predetermined period that the integral power consumption exceeds a predetermined power consumption.

In the second feature, the control step includes a step of deactivating the acquisition function when it is determined at each time point in the predetermined period that the integral power consumption falls below the predetermined power consumption.

In the second feature, the control step includes a step of activating the acquisition function after a predetermined timing in the predetermined period.

In the second feature, the control step includes a step of activating the acquisition function, for a load having an amount of power consumption that has a ratio relative to the integral power consumption exceeding a predetermined ratio, out of the plurality of loads.

DESCRIPTION OF EMBODIMENTS

Figure 1:
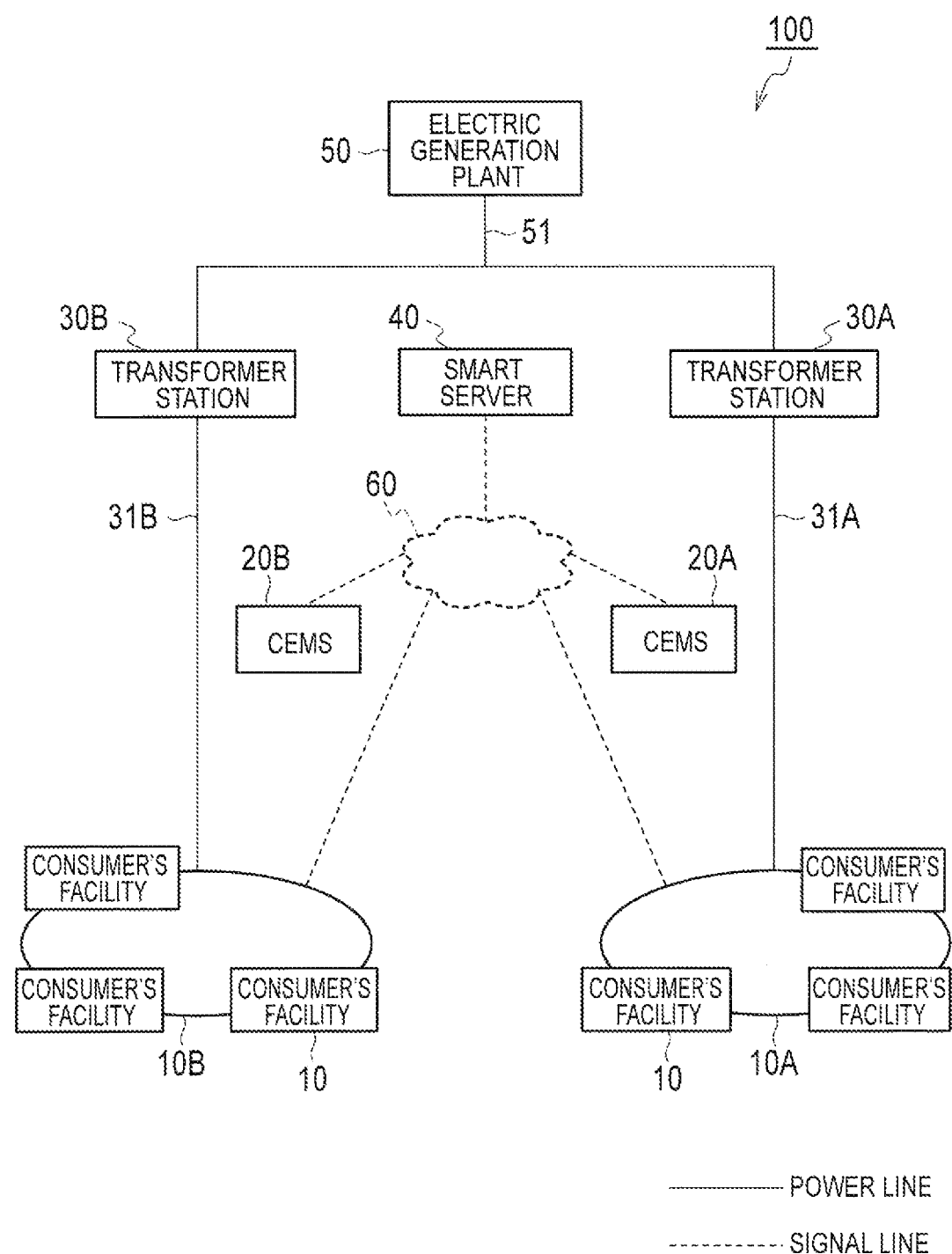
FIG. 1 is a diagram showing an energy management system 100 according to a first embodiment.

Hereinafter, an energy management apparatus and energy management system according to embodiments of the present invention will be described with reference to the drawings. In the following drawings, identical or similar components are denoted by identical or similar reference numerals.

It should be understood that the drawings are schematic only and the ratio of dimensions is not to scale. Therefore, specific dimensions should be determined with reference to the description below. It is needless to mention that different relationships and ratio of dimensions may be included in different drawings.

Outline of Embodiments

Firstly, a power management apparatus according to embodiments is for performing a control so that an integral power consumption supplied from a grid in a predetermined period does not exceed a predetermined power consumption. The power management apparatus includes a control unit which controls a function of acquiring an amount of power consumption of a load connected to the grid, in the predetermined period. The control unit activates the acquisition function when it is determined at each time point in the predetermined period that the integral power consumption exceeds a predetermined power consumption.

In embodiments, the control unit activates the acquisition function when it is determined at each time point in the predetermined period that the integral power consumption exceeds the predetermined power consumption. That is, the acquisition function is activated when it is necessary to acquire the amount of power consumption of the load. Therefore, the amount of power consumption that is necessary for acquiring the amount of power consumption of a load is restrained while appropriately acquiring the amount of power consumption of the load.

Secondly, a power management apparatus according to embodiments is for performing a control so that an integral power consumption supplied from a grid in a predetermined period does not exceed a predetermined power consumption. The power management apparatus includes a control unit which controls a function of acquiring an amount of power consumption of a load connected to the grid, in the predetermined period. The control unit activates the acquisition function after a predetermined timing in the predetermined period.

In the embodiment, the control unit activates the acquisition function after the predetermined timing in the predetermined period. That is, the acquisition function is activated when it is necessary to acquire the amount of power consumption of a load. Therefore, the amount of power consumption that is necessary for acquiring the amount of power consumption of the load is restrained while appropriately acquiring the amount of power consumption of the load.

Thirdly, a power management apparatus according to embodiments is for performing a control so that an integral power consumption supplied from a grid in a predetermined period does not exceed a predetermined power consumption. The power management apparatus includes a control unit which controls a function of acquiring an amount of power consumption of a load connected to the grid, in the predetermined period. The control unit activates the acquisition function, for a load having an amount of power consumption that has a ratio relative to the integral power consumption exceeding a predetermined ratio, out of the plurality of loads.

In the embodiment, the control unit activates the acquisition function, for the load having the amount of power consumption that has the ratio relative to the integral power consumption exceeding the predetermined ratio, out of the plurality of loads. That is, the acquisition function is activated only in the load in which the power needs to be consumed. Therefore, the amount of power consumption that is necessary for acquiring an amount of power consumption of a load is restrained while appropriately acquiring the amount of power consumption of the load.

In the embodiment, the activation of the acquisition function may be an operation of starting acquiring the amount of power consumption of a load (releasing of a sleep mode). Alternatively, the activation of the acquisition function may be an operation of shortening an interval of acquiring the amount of power consumption of a load. Further, deactivation of the acquisition function may include an operation of stopping acquiring the amount of power consumption of a load (starting a sleep mode). Alternatively, activation of the acquisition function may be an operation of extending an interval of acquiring the amount of power consumption of a load.

In the embodiment, the function of acquiring the amount of power consumption of a load is at least one of a function of measuring an amount of power consumption of a load by an equipment connected to the load; and a function of reporting the amount of power consumption of a load from the equipment connected to the load.

First Embodiment

Energy Management System

The energy management system according to the first embodiment will be described, below. FIG. 1 is a diagram showing an energy management system 100 according to the first embodiment.

As shown in FIG. 1, the energy management system 100 includes a consumer's facility, a CEMS 20, a transformer station 30, a smart server 40, and an electric generation plant 50. It is noted that the consumer's facility, the CEMS 20, the transformer station 30, and the smart server 40 are connected by a network 60.

The consumer's facility has a power generation apparatus and a power storage apparatus, for example. The power generation apparatus is an apparatus which uses fuel gas to output power such as a fuel cell, for example. The power storage apparatus such as a secondary battery is an apparatus in which power is stored.

The consumer's facility is a shop such as a corner store and a supermarket. It is noted that the consumer's facility may be a detached residence, a housing complex such as an apartment house, a business facility such as an office building, or a factory.

In the first embodiment, a consumer's facility group 10A and a consumer's facility group 10B are configured by a plurality of the consumer facilities 10. The consumer's facility group 10A and consumer's facility group 10B are classified into each geographical region, for example.

The CEMS 20 controls an interconnection between the plurality of consumer facilities 10 and the power grid. It is noted that the CEMS 20 may be also called a CEMS (Cluster/Community Energy Management System), since the CEMS 20 manages the plurality of consumer facilities 10. Specifically, the CEMS 20 disconnects the plurality of consumer facilities 10 and the power grid at a power failure or the like. On the other hand, the CEMS 20 interconnects the plurality of consumer facilities 10 to the power grid, for example, at restoration of power.

In the first embodiment, a CEMS 20A and a CEMS 20B are provided. The CEMS 20A controls an interconnection between the consumer facilities 10 included in the consumer's facility group 10A and the power grid, for example. The CEMS 20B controls an interconnection between the consumer facilities 10 included in the consumer's facility group 10B and the power grid, for example.

The transformer station 30 supplies power to the plurality of consumer facilities 10 through a distribution line 31. Specifically, the transformer station 30 lowers the voltage supplied from the electric generation plant 50.

In the first embodiment, a transformer station 30A and a transformer station 30B are provided. The transformer station 30A supplies power to the consumer facilities 10 included in the consumer's facility group 10A through a distribution line 31A, for example. The transformer station 30B supplies power to the consumer facilities 10 included in the consumer's facility group 10B through a distribution line 31B, for example.

The smart server 40 manages a plurality of the CEMSs 20 (here, the CEMS 20A and CEMS 20B). Further, the smart server 40 manages a plurality of the transformer stations 30 (here, the transformer station 30A and the transformer station 30B). In other words, the smart server 40 integrally manages the consumer facilities 10 included in the consumer's facility groups 10A and 10B. For example, the smart server 40 has a function of balancing the power to be supplied to the consumer's facility group 10A and the power to be supplied to the consumer's facility group 10B.

The electric generation plant 50 generates power by thermal power, wind power, water power, atomic power or the like. The electric generation plant 50 supplies power to the plurality of the transformer stations 30 (here, the transformer station 30A and the transformer station 30B) through an electric feeder line 51.

The network 60 is connected to each apparatus via a signal line. The network 60 is an Internet, a wide area network, a narrow area network, and a mobile phone network, for example.

(Consumer's Facility)

Figure 2:
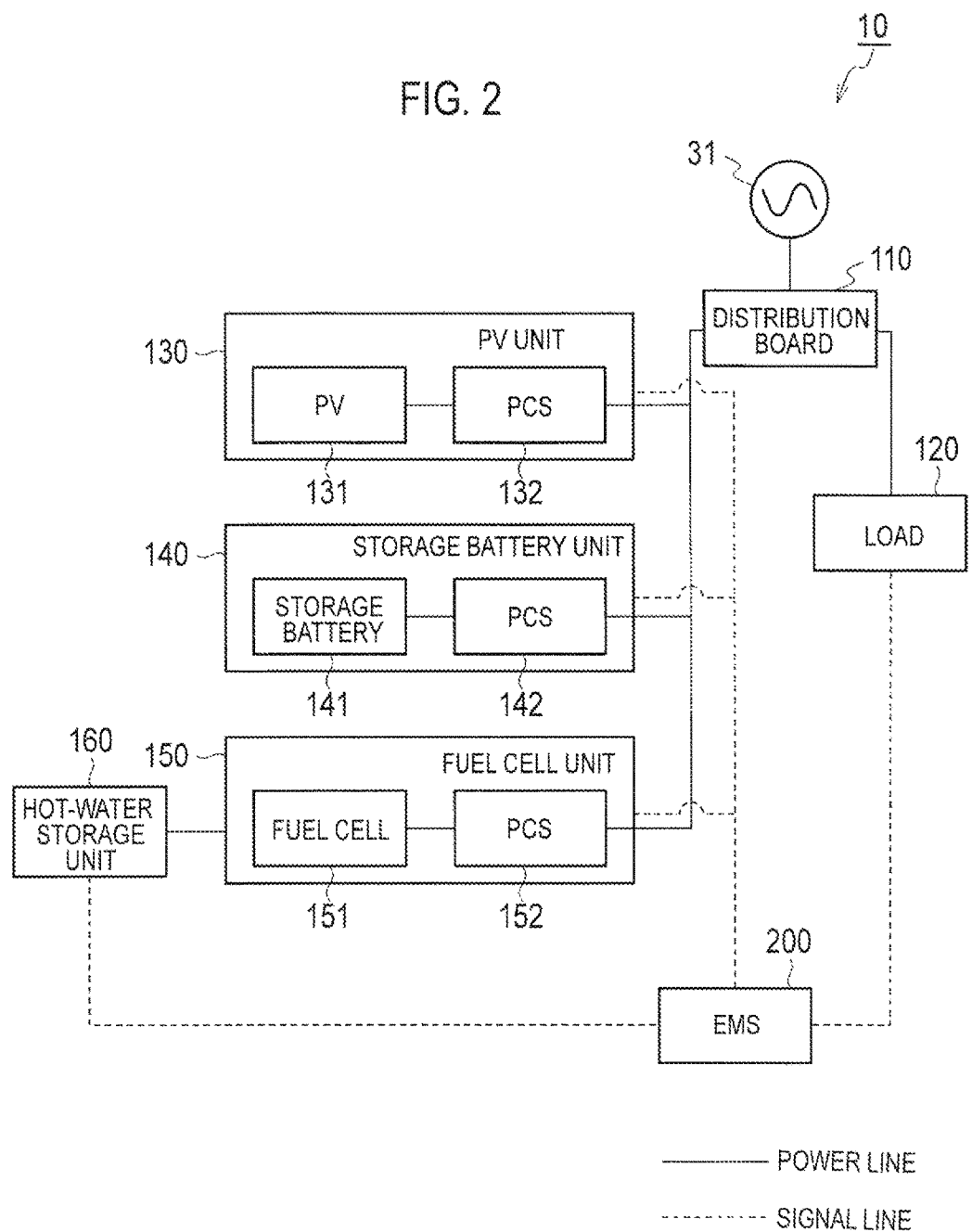
FIG. 2 is a diagram showing a consumer's facility 10 according to the first embodiment.

The consumer's facility according to the first embodiment will be described, below. FIG. 2 is a diagram showing the details of the consumer's facility according to the first embodiment.

As shown in FIG. 2, the consumer's facility includes a distribution board 110, a load 120, a PV unit 130, a storage battery unit 140, a fuel cell unit 150, a hot-water storage unit 160, and an EMS 200.

The distribution board 110 is connected to the distribution line 31 (grid). The distribution board 110 is connected, via a power line, to the load 120, the PV unit 130, the storage battery unit 140, and the fuel cell unit 150.

The load 120 is an apparatus which consumes the power supplied via a power line. Examples of the load 120 include an apparatus such as a refrigerator, a freezer, a lighting, and an air conditioner.

The PV unit 130 includes a PV 131 and a PCS 132. The PV 131 is an example of the power generation apparatus, and is a solar light power generation apparatus which generates power in response to reception of solar light. The PV 131 outputs the generated DC power. The amount of power generated by the PV 131 varies depending on the amount of solar radiation entering the PV 131. The PCS 132 is an apparatus (Power Conditioning System) which converts the DC power output from the PV 131, into AC power. The PCS 132 outputs the AC power to the distribution board 110 via a power line.

In the first embodiment, the PV unit 130 may include a pyranometer which measures the solar radiation entering the PV 131.

The PV unit 130 is controlled by an MPPT (Maximum Power Point Tracking) method. In particular, the PV unit 130 optimizes an operation point (point determined by an operation-point voltage value and power value, or a point determined by an operation-point voltage value and current value) of the PV 131.

The storage battery unit 140 includes a storage battery 141 and a PCS 142. The storage battery 141 is an apparatus which stores power. The PCS 142 is an apparatus (Power Conditioning System) which converts the AC power supplied from the distribution line 31 (grid), into DC power. Further, the PCS 142 converts the DC power output from the storage battery 141, into AC power.

The fuel cell unit 150 includes a fuel cell 151 and a PCS 152. The fuel cell 151 is an example of a power generation apparatus, and an apparatus which outputs power by using a fuel gas. The PCS 152 is an apparatus (Power Conditioning System) which converts the DC power output from the fuel cell 151, into AC power.

The fuel cell unit 150 is operated by load following control. In particular, the fuel cell unit 150 controls the fuel cell 151 so that the power output from the fuel cell 151 reaches a target power of the load following control.

The hot-water storage unit 160 is an example of a heat storage apparatus which converts power into heat and stores the heat, and stores as hot water the heat generated by a co-generation equipment such as the fuel cell unit 150. Specifically, the hot-water storage unit 160 includes a hot-water storage tank where the water supplied from the hot-water storage tank is warmed by the heat exhausted by drive (power generation) of the fuel cell 151. In particular, the hot-water storage unit 160 warms the water supplied from the hot-water storage tank and feeds the warmed water back to the hot-water storage tank.

The EMS 200 is an apparatus (Energy Management System) which controls the PV unit 130, the storage battery unit 140, the fuel cell unit 150, and the hot-water storage unit 160. Specifically, the EMS 200 is connected, via a signal line, to the PV unit 130, the storage battery unit 140, the fuel cell unit 150, and the hot-water storage unit 160, and controls the PV unit 130, the storage battery unit 140, the fuel cell unit 150, and the hot-water storage unit 160. Further, the EMS 200 controls an operation mode of the load 120 to control the power consumption of the load 120.

Further, the EMS 200 is connected, via the network 60, to various types of servers. The various types of servers store information such as a purchase unit price of power supplied from a grid, a sales unit price of the power supplied from the grid, and a purchase unit price of fuel gas, for example (hereinafter, energy rate information).

Alternatively, various types of servers store information for predicting the power consumption of the load 120 (hereinafter, consumed-energy prediction information), for example. The consumed-energy prediction information may be generated on the basis of an actual value of the power consumption of the load 120 in the past, for example. Alternatively, the consumed-energy prediction information may be a model of the power consumption of the load 120.

Alternatively, various types of servers store information for predicting an amount of power generated by the PV 131 (hereinafter, PV-power-generation-amount prediction information), for example. The PV-power-generation prediction information may be a predicted value of a solar radiation entering the PV 131. Alternatively, the PV-power-generation prediction information may be a weather forecast, a season, and hours of sunlight, for example.

(Application Scene)

Figure 3:
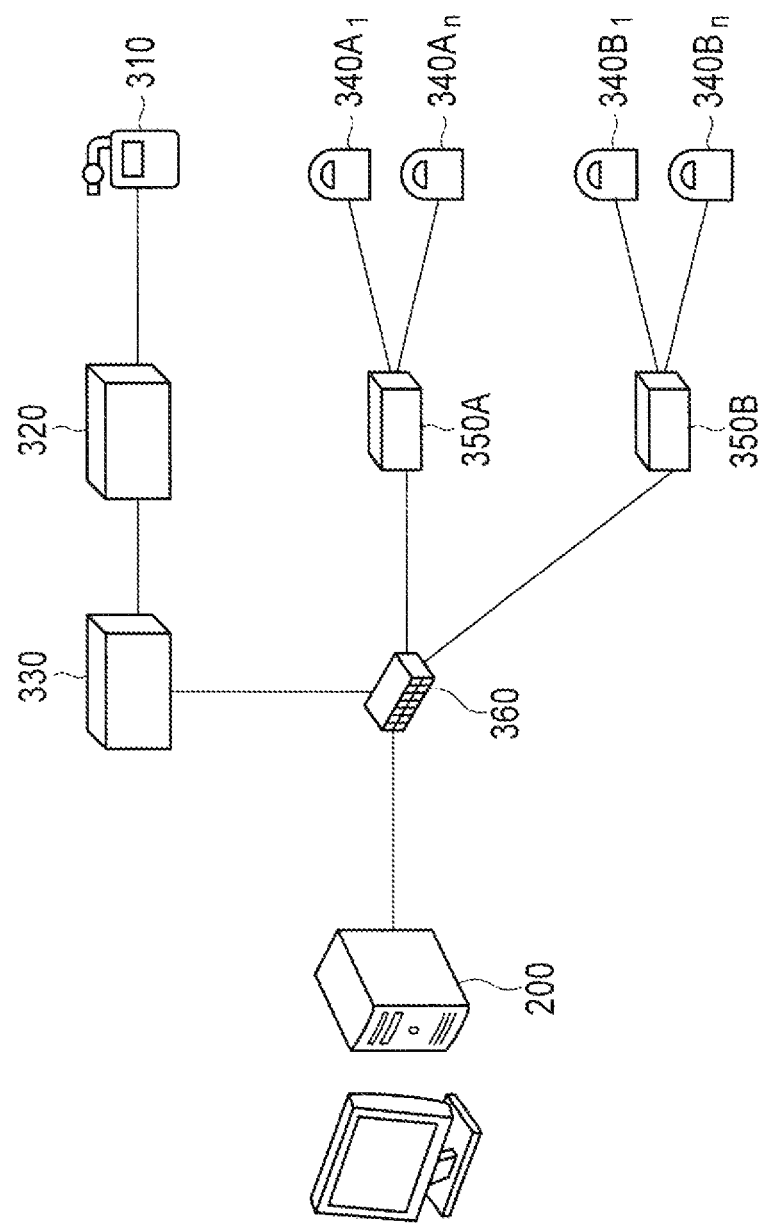
FIG. 3 is a diagram for describing an application scene of the first embodiment.

Application scene of the first embodiment will be described, below. FIG. 3 is a diagram for describing an application scene of the first embodiment. In FIG. 3, a flow of information in the consumer's facility will be mainly described.

As shown in FIG. 3, the consumer's facility includes a grid power meter 310, a demand measurement unit 320, a demand monitor unit 330, a load power meter 340, a smart sensor 350, and a hub 360. As described above, the consumer's facility includes the EMS 200.

The grid power meter 310 measures the power supplied from the distribution line 31 (gird). Specifically, the grid power meter 310 is arranged closer to the distribution line 31 (grid) side relative to the distribution board 110, and measures the power supplied to the entire consumer's facility.

The demand measurement unit 320 accumulates the power measured by the grid power meter 310, in a predetermined period (for example, 30 minutes). In other words, the demand measurement unit 320 accumulates the power measured by the grid power meter 310 from a start timing of the predetermined period to an expiration timing of the predetermined period. That is, the demand measurement unit 320 resets the accumulated value (integral power consumption) for each predetermined period.

The demand monitor unit 330 transmits information indicating an accumulated value (integral power consumption) acquired from the demand measurement unit 320, to the EMS 200.

Alternatively, the demand monitor unit 330 may predict the integral power consumption at the expiration timing of a predetermined period, on the basis of the accumulated value (integral power consumption) acquired from the demand measurement unit 320. In such a case, the demand monitor unit 330 preferably transmits, to the EMS 200, information indicating that the predicted value of the integral power consumption exceeds a predetermined power consumption, when the predicted value of the integral power consumption at the expiration timing of a predetermined period exceeds the predetermined power consumption.

The load power meter 340 is arranged besides each load 120, and measures the power consumed by each load 120. In the first embodiment, as the load power meter 340, second power meters $340A_1$ to $340A_n$, and second power meters $340B_1$ to $340B_n$ are arranged. The second power meters $340A_1$ to $340A_n$ are connected to a power line A arranged under the control of a breaker A of the distribution board 110, and the second power meters $340B_1$ to $340B_n$ are connected to a power line B arranged under the control of a breaker B of the distribution board 110.

The smart sensor 350 collects the power measured by the plurality of load power meters 340 arranged under the control of the smart sensor 350. In the first embodiment, as the smart sensor 350, a smart sensor 350A and a smart sensor 350B are arranged. The smart sensor 350A collects the power measured by the second power meters $340A_1$ to $340A_n$. The smart sensor 350B collects the power measured by the second power meters $340B_1$ to $340B_n$.

The smart sensor 350 transmits an identifier of each of the plurality of load power meters 340 and information indicating the power measured by each of the plurality of load power meters 340, to the EMS 200. Alternatively, the smart sensor 350 transmits the information indicating a collected value of the power measured by the plurality of load power meters 340, to the EMS 200.

The hub 360 is connected, via a signal line, to the EMS 200, the demand monitor unit 330, and the smart sensor 350. The hub 360 relays the information output from the demand monitor unit 330 and the smart sensor 350, to the EMS 200.

(Configuration of EMS)

Figure 4:
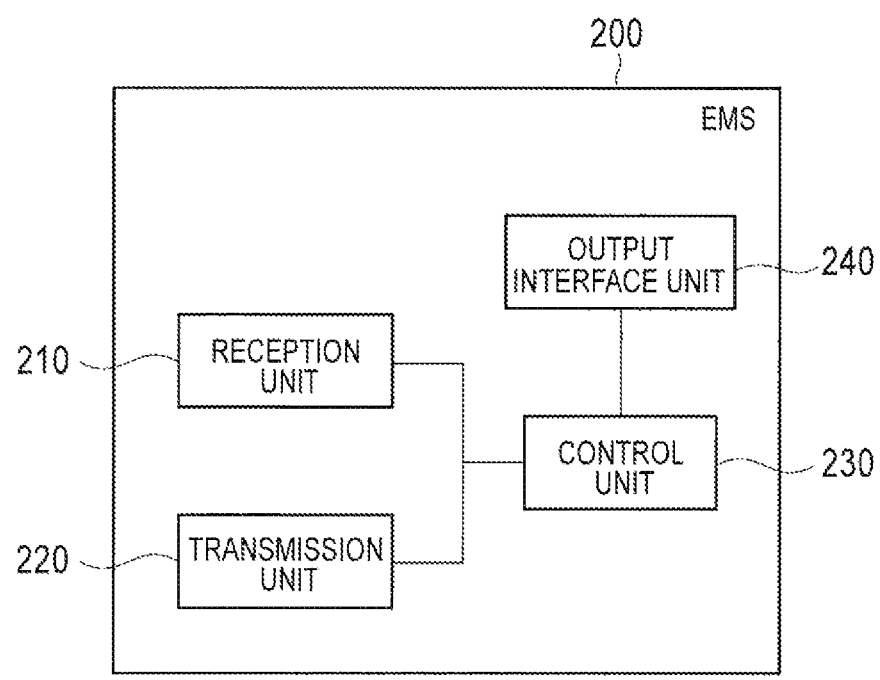
FIG. 4 is a diagram showing an EMS 200 according to the first embodiment.

The EMS of the first embodiment is described, below. FIG. 4 is a block diagram showing the EMS 200 according to the first embodiment.

As shown in FIG. 4, the EMS 200 has a reception unit 210, a transmission unit 220, a control unit 230, and a output interface unit 240.

The reception unit 210 receives various types of signals from an apparatus connected via a signal line. For example, the reception unit 210 receives the information indicating the integral power consumption, from the demand monitor unit 330. The reception unit 210 transmits an identifier of each of the plurality of load power meters 340 and information indicating the power measured by each of the plurality of load power meters 340, from the smart sensor 350. Alternatively, the reception unit 210 may receive the information indicating the power collected by the smart sensor 350, from the smart sensor 350.

In the first embodiment, the reception unit 210 may receive the information indicating the amount of power generated by the PV 131, from the PV unit 130. The reception unit 210 may receive the information indicating the amount of power to be stored in the storage battery 141, from the storage battery unit 140. The reception unit 210 may receive the information indicating the amount of power generated by the fuel cell 151, from the fuel cell unit 150. The reception unit 210 may receive the information indicating the amount of hot water to be stored in hot-water storage unit 160, from the hot-water storage unit 160.

In the first embodiment, the reception unit 210 may receive the energy rate information, the consumed-energy prediction information, and the PV-power-generation-amount prediction information from the various types of servers via the network 60. However, the energy rate information, the consumed-energy prediction information, and the PV-power-generation-amount prediction information may be stored in advance in the EMS 200.

The transmission unit 220 transmits various types of signals to an apparatus connected via a signal line. For example, the transmission unit 220 transmits a signal for controlling the PV unit 130, the storage battery unit 140, the fuel cell unit 150, and the hot-water storage unit 160, to each apparatus. The transmission unit 220 transmits a control signal for controlling the load 120, to the load 120.

The control unit 230 controls the load 120, the PV unit 130, the storage battery unit 140, the fuel cell unit 150, and the hot-water storage unit 160.

In the first embodiment, the control unit 230 generates a list of loads including the amount of power consumption of a load. The list of loads may be stationary presented and may be presented when the predicted value of the integral power consumption exceeds a predetermined power consumption.

Specifically, the control unit 230 generates a list of loads on the basis of the power measured by each of the plurality of load power meters 340. The list of loads includes at least a name of a load and an amount of power consumption of a load, for example. The list of loads may include a variation amount of power consumption, in addition to this information.

In the first embodiment, the control unit 230 controls a function of acquiring the amount of power consumption of a load connected to a grid, in a predetermined period. In particular, the control unit 230 controls an equipment (the plurality of load power meters 340 or the smart sensor 350) connected to a load so as to control the function of acquiring the amount of power consumption of a load. Description continues where the equipment connected to the load is the plurality of load power meters 340, below.

Here, the function of acquiring the amount of power consumption of a load is at least one of a function of measuring an amount of power consumption of a load by the plurality of load power meters 340; and a function of reporting the amount of power consumption of a load from the plurality of load power meters 340.

Firstly, the control unit 230 activates a function of acquiring the amount of power consumption of a load when it is determined at each time point in a predetermined period that an integral power consumption exceeds a predetermined power consumption. On the other hand, the control unit 230 deactivates a function of acquiring the amount of power consumption of a load when it is determined at each time point in a predetermined period that an integral power consumption falls below a predetermined power consumption.

Secondly, the control unit 230 activates the acquisition function after a predetermined timing in a predetermined period. The predetermined timing may be a timing of one half of a predetermined period and may be a timing of one third of a predetermined period.

Here, the control unit 230 may change a duration of acquiring the amount of power consumption of a load, in accordance with a remaining time of a predetermined period. Specifically, the control unit 230 activates the function of acquiring the amount of power consumption of a load in a short duration as the remaining time of a predetermined period is shorter. That is, the control unit 230 controls the function so as to enhance a frequency of acquiring the amount of power consumption as the remaining time of a predetermined period is shorter.

Thirdly, the control unit 230 selects the function of acquiring the amount of power consumption of a load a plurality of loads that has an amount of power consumption that has a ratio relative to the integral power consumption exceeding a predetermined ratio and activates the function of acquiring the amount of power consumption of the selected load.

Here, the activation of the acquisition function may be an operation of starting acquiring the amount of power consumption of a load (releasing of a sleep mode). Alternatively, the activation of the acquisition function may be an operation of shortening an interval of acquiring the amount of power consumption of a load. Further, deactivation of the acquisition function may include an operation of stopping acquiring the amount of power consumption of a load (starting a sleep mode). Alternatively, activation of the acquisition function may be an operation of extending an interval of acquiring the amount of power consumption of a load.

The output interface unit 240 presents various types of information to a user. Specifically, the output interface unit 240 is a display which displays each item of information. However, the output interface unit 240 may be a speaker which outputs each item of information with sound.

In this case, the output interface unit 240 may present a list on an application that acquires the amount of power consumption of the load 120 or a browser, when the list is presented.

Figure 5:
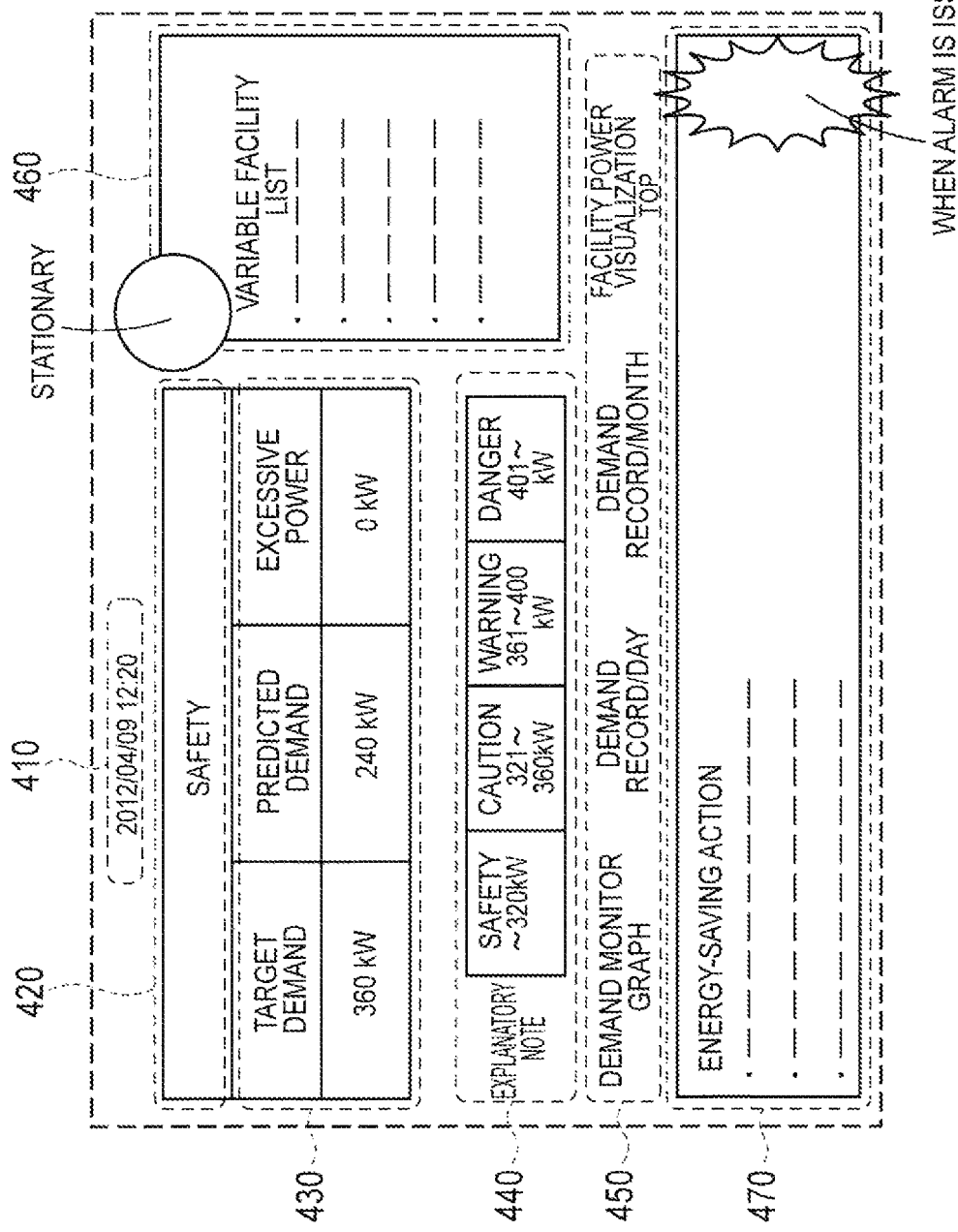
FIG. 5 is a diagram showing presented information 400 according to the first embodiment.

In the first embodiment, the output interface unit 240 displays presented information 400 shown in FIG. 5, for example. The presented information 400 includes date-and-time information 410, state overview information 420, state detail information 430, state explanatory-notes information 440, link information 450, variable facility list 460, and an energy-saving action 470.

The date-and-time information 410 is information indicating a current date and time.

The state overview information 420 is information indicating an overview of a state of power supplied from a grid in a current predetermined period. The state overview information 420 is expressed in four stages (safety, caution, warning, and danger), for example.

The state detail information 430 is information indicating a detail of a state of power supplied from a grid in a current predetermined period. The state detail information 430 includes a target demand value, a predicted demand value, and an excessive power, for example. The target demand value is a target value of power supplied from a grid in a predetermined period. The predicted demand value is a predicted value of the integral power consumption predicted by the above-described demand monitor unit 330. The excessive power is a power amount by which the predicted demand value exceeds the target demand value. The unit of the demand value is kW/h.

The state explanatory-notes information 440 is information indicating explanatory notes of the state overview information 420. The state explanatory-notes information 440 includes a threshold value of each stage (safety, caution, warning, and danger) and a color expressing each stage, for example.

The link information 450 is information indicating various types of information (the demand monitor graph, the demand record/day, the demand record/month, the facility power visualization TOP) that can be switched from the presented information 400. The "demand monitor graph" is a graph shown in FIG. 6, described later, for example. The "demand record/day" and the "demand record/month" are a summary result of the past history. The "facility power visualization TOP" is a top page corresponding to the uppermost layer of the information that can be presented by the presented information 400. When the link information 450 is selected (clicked), the information presented by the output interface unit 240 is switched to the selected information.

The variable facility list 460 is a stationary presented list of loads. The variable facility list 460 includes a name of a load and an amount of power consumption of the load, for example.

In this case, the variable facility list 460 may be a list including a predetermined number of loads in the descending order of power consumption, and may be a list on which a predetermined number of loads are highlighted in the descending order of power consumption, out of the loads connected to the grid.

The energy-saving action 470 is a list presented when the predicted value of the integral power consumption exceeds a predetermined power consumption. The energy-saving action 470 is an example of an alarm showing the list of loads in which the amount of power consumption should be restrained.

In the first embodiment, the energy-saving action 470 is presented in a first mode and a second mode. As described above, in the first mode, a list of loads is presented in the descending order of the actual value of power acquired by the load power meter 340. In the second mode, a list of loads is presented in the descending order of the variation amount of power acquired by the load power meter 340.

In this case, when the energy-saving action 470 is presented in the first mode, the energy-saving action 470 may be a list including a predetermined number of loads in the descending order of power consumption, and may be a list on which a predetermined number of loads are highlighted in the descending order of power consumption, out of the loads connected to the grid. On the other hand, when the energy-saving action 470 is presented in the second mode, the energy-saving action 470 may be a list including a predetermined number of loads in the descending order of the increased amount of power consumption, out of the loads connected to the grid, and may be a list on which a predetermined number of loads are highlighted in the descending order of power consumption, out of the loads connected to the grid.

(Demand Monitor Graph)

Figure 6:
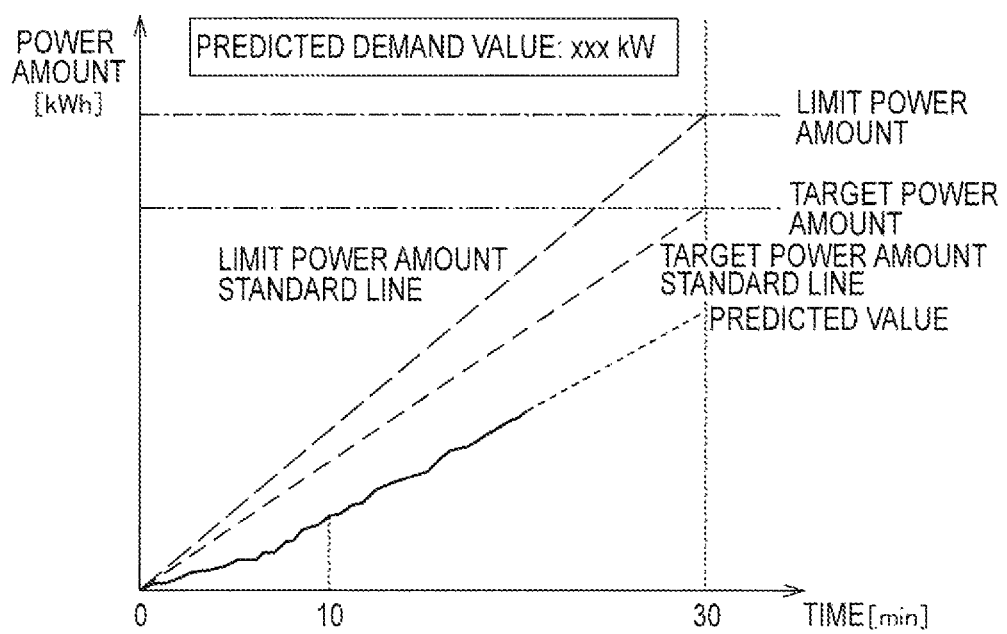
FIG. 6 is a diagram for describing a demand monitor graph according to the first embodiment.

The demand monitor graph according to the first embodiment will be described, below. FIG. 6 is a diagram for describing a demand monitor graph according to the first embodiment.

As shown in FIG. 6, the demand monitor graph includes an accumulated value of the power supplied from the grid (integral power consumption), in a current date and time included in a predetermined period (for example, 30 minutes). In particular, the actual value of the integral power consumption is indicated by a solid line and the predicted value of the integral power consumption is indicated by a dotted line.

Firstly, the demand monitor graph includes a limit power amount, as predetermined power. The demand monitor graph may include a limit power amount standard line from which the integral power consumption becomes a limit power amount at the expiration timing of a predetermined period. As shown in FIG. 6, the limit power amount standard line is a line showing a transition of a threshold value set so that the integral power consumption reaches a predetermined power consumption at the expiration timing of a predetermined period and increases in proportion to the elapse of time.

Secondly, the demand monitor flag includes a target power amount, as predetermined power. The target power amount is a target value determined so that the limit power amount is not exceeded at the expiration timing of a predetermined period. The demand monitor graph may include a target power amount standard line from which the integral power consumption becomes a target power amount at the expiration timing of a predetermined period. As shown in FIG. 6, the target power amount standard line is a line showing a transition of a threshold value set so that the integral power consumption reaches a predetermined power consumption at the expiration timing of a predetermined period and increases in proportion to the elapse of time.

In such a case, the control unit 230 preferably outputs an alarm (first alarm) to a user when the integral power consumption exceeds the limit power amount standard line at each time point in a predetermined period. Likewise, the control unit 230 preferably outputs an alarm (second alarm) to a user when the integral power consumption exceeds the target power amount standard line at each time point in a predetermined period.

The first alarm is preferably different from the second alarm. Specifically, it is preferred that the first alarm is an alarm having a higher emergency than the second alarm and more conspicuous than the second alarm. For example, when an alarm sound is output as an alarm, the alarm sound of the first alarm is bigger than the alarm sound of the second alarm. Alternatively, when a lamp is illuminated or flickered as the first alarm, a red lamp is illuminated or flickered as the first alarm and a yellow lamp is illuminated or flickered as the second alarm. Alternatively, when a lamp is flickered as the alarm, a flickering interval of the lamp of the first alarm is shorter than a flickering interval of the lamp of the second alarm.

In this case, the demand monitor graph may include the predicted value of the integral power consumption (predicted demand value) at the expiration timing of a predetermined period. In such a case, the control unit 230 may output an alarm to a user when the predicted value of the integral power consumption (predicted demand value) exceeds the target power amount (or the limit power amount).

(First Control Example of Acquisition Function)

Figure 7:
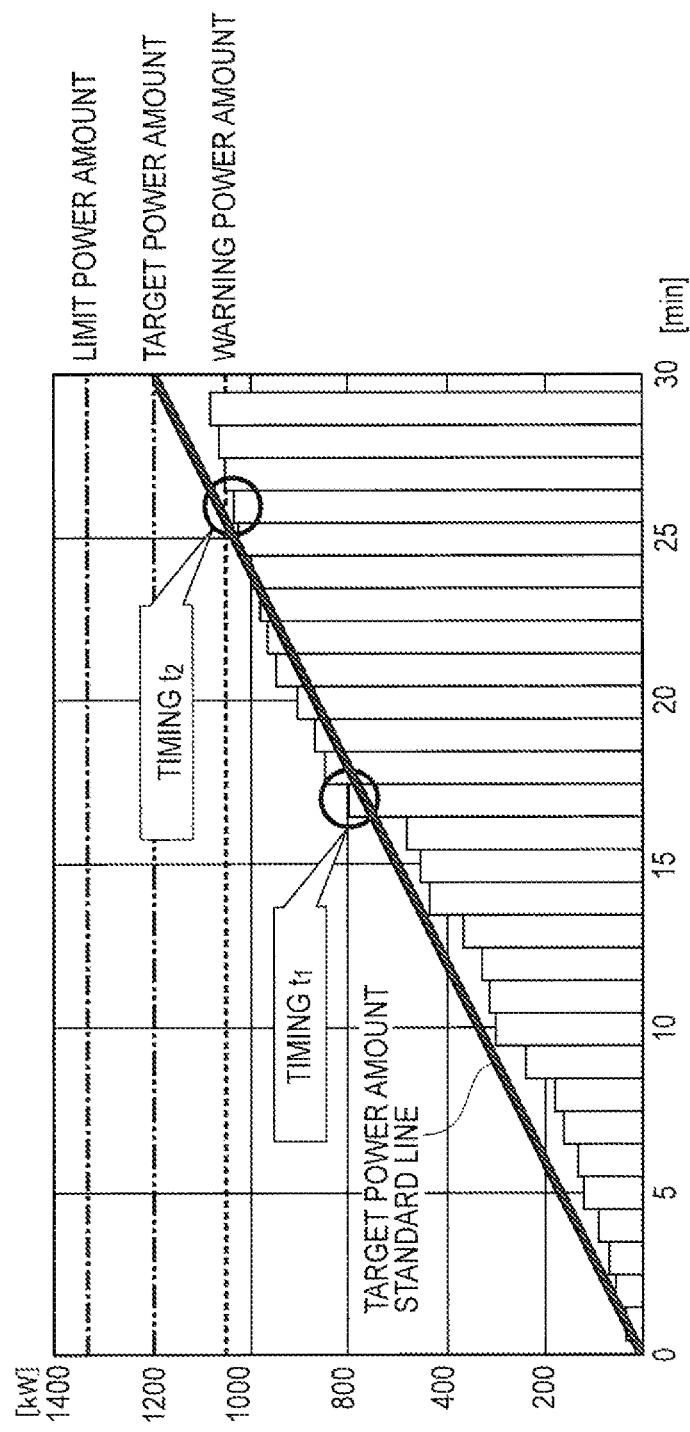
FIG. 7 is a diagram showing an overview of a first control example of an acquisition function according to the first embodiment.
Figure 8:
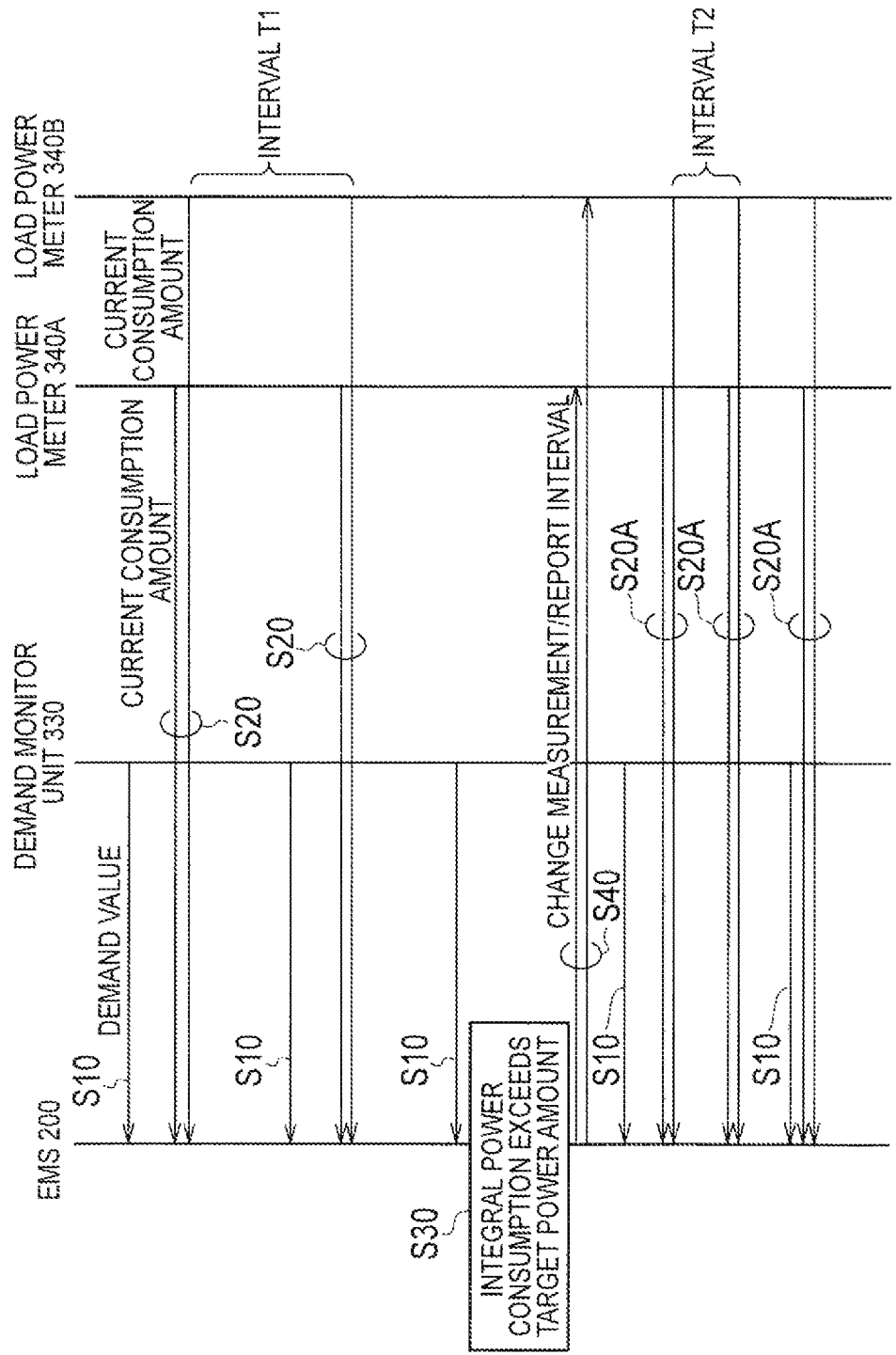
FIG. 8 is a diagram showing a sequence of the first control example of the acquisition function according to the first embodiment.

A first control example of the acquisition function according to the first embodiment will be described, below. FIG. 7 is a diagram showing an overview of the first control example of the acquisition function according to the first embodiment. FIG. 8 is a diagram showing a sequence of the first control example of the acquisition function according to the first embodiment.

As shown in FIG. 7, the control unit 230 activates the function of acquiring the amount of power consumption of a load at a timing $T_1$ at which the integral power consumption exceeds the target power amount standard line. On the other hand, the control unit 230 deactivates the function of acquiring the amount of power consumption of a load at a timing $T_2$ at which the integral power consumption falls below the target power amount standard line.

As shown in FIG. 8, in step 10, the EMS 200 cyclically receives the integral power consumption (demand value) from the demand monitor unit 330.

In step 20, the EMS 200 cyclically receives the amount of power consumption of a load from each of the plurality of load power meters 340.

In step 30, the EMS 200 determines that the integral power consumption exceeds the target power amount.

In step 40, the EMS 200 instructs each of the plurality of load power meters 340 to change the measurement interval of the power consumption of a load and the report interval of the consumption power. It should be noted that in this case, the EMS 200 instructs shortening of the measurement interval of the power consumption of a load and the report interval of the power consumption.

Thereby, as shown in step 20A, the report interval of the amount of power consumption is shortened from an interval T1 to an interval T2.

In a case shown in FIG. 8, a case where it is determined that the integral power consumption exceeds the target power amount is illustrated; however, the EMS 200 may instruct extending of the measurement interval of the power consumption of a load and the report interval of the power consumption when it is determined that the integral power consumption falls below the target power amount.

It should be noted that in this case, as an example of activation of the acquisition function only, shortening of the measurement interval and the report interval are described.

(Second Control Example of Acquisition Function)

Figure 9:
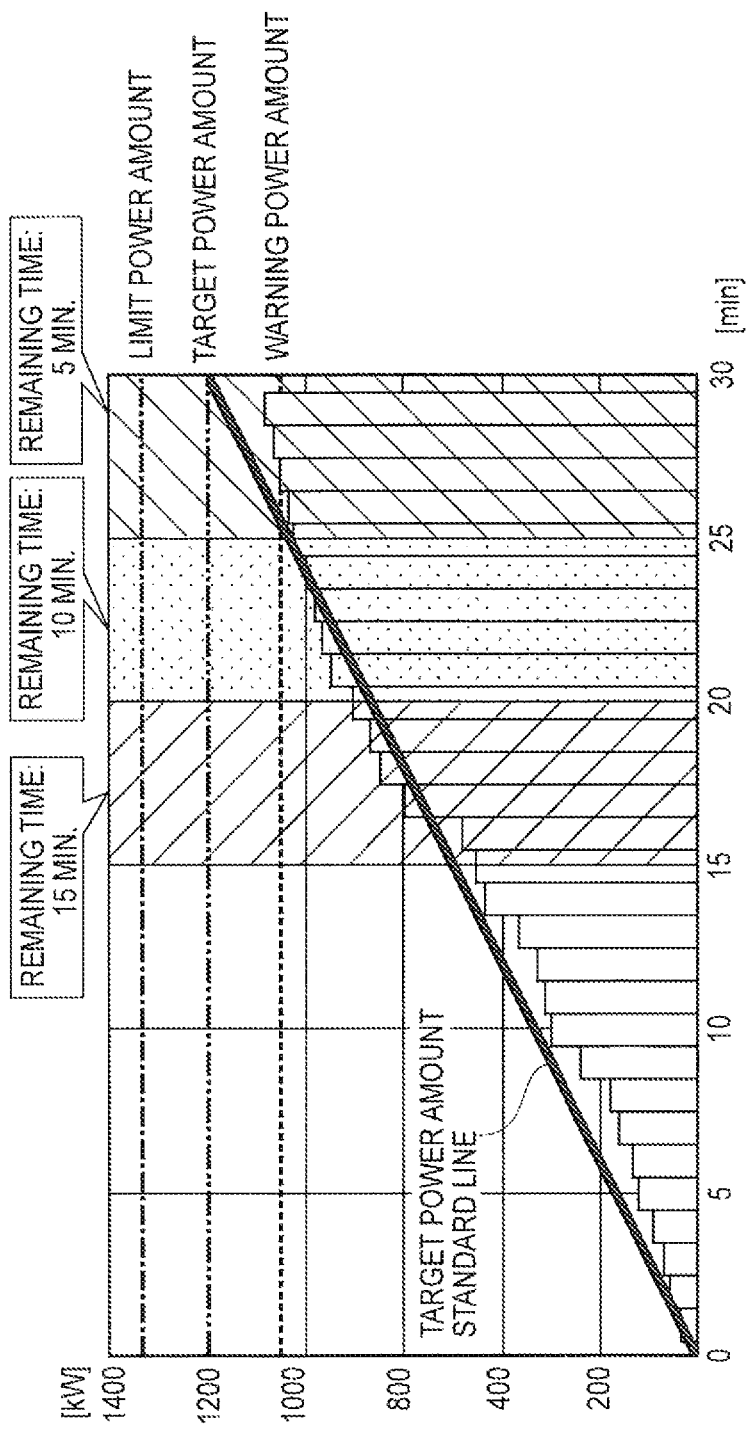
FIG. 9 is a diagram showing an overview of a second control example of the acquisition function according to the first embodiment.
Figure 10:
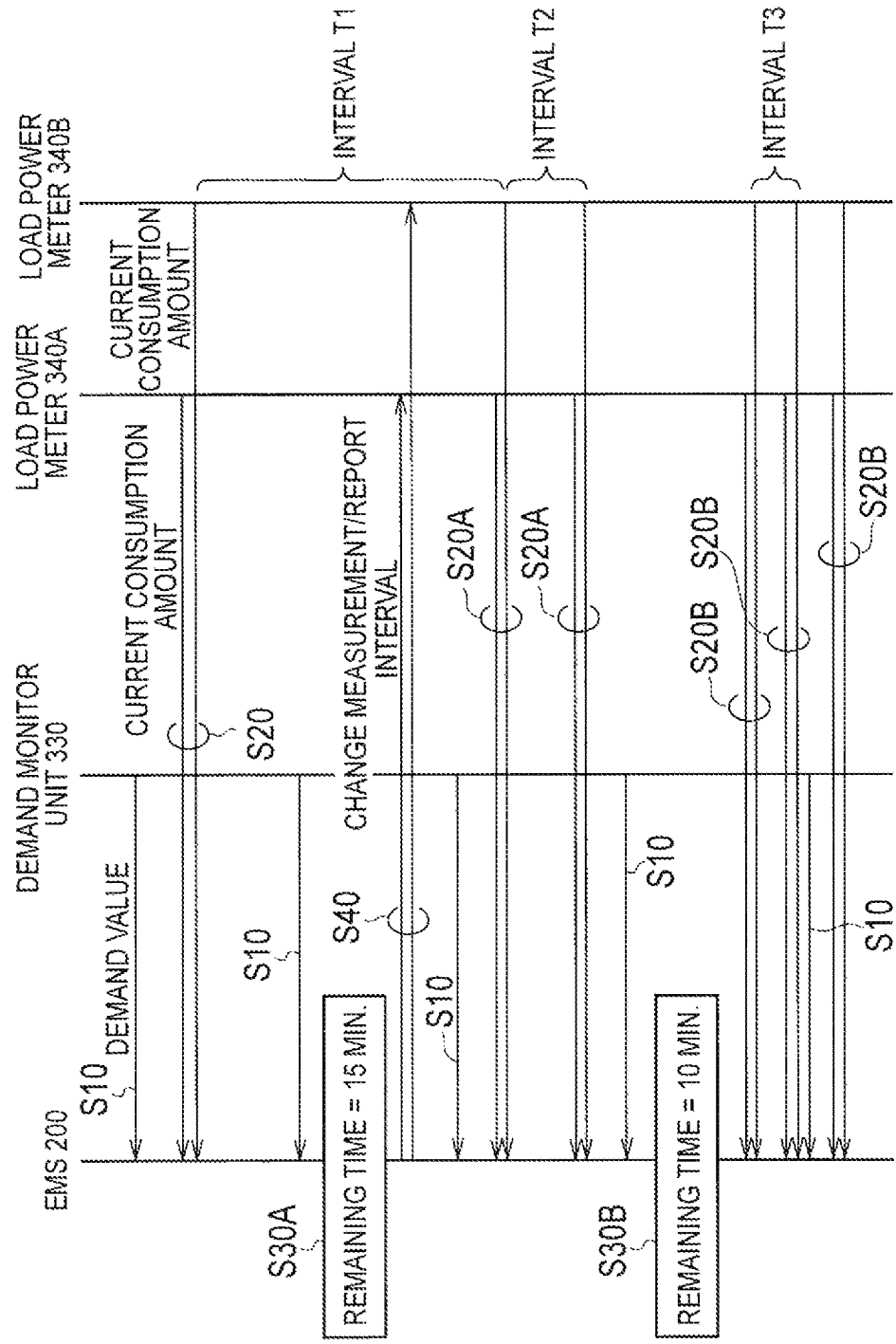
FIG. 10 a diagram showing a sequence of the second control example of the acquisition function according to the first embodiment.

A second control example of the acquisition function according to the first embodiment will be described, below. FIG. 9 is a diagram showing an overview of the second control example of the acquisition function according to the first embodiment. FIG. 10 is a diagram showing a sequence of the second control example of the acquisition function according to the first embodiment.

As shown in FIG. 9, the control unit 230 changes the level of activation of the function of acquiring the amount of power consumption of a load, in accordance with a remaining time of a predetermined period.

As shown in FIG. 10, in step 10, the EMS 200 cyclically receives the integral power consumption (demand value) from the demand monitor unit 330.

In step 20, the EMS 200 cyclically receives the amount of power consumption of a load from each of the plurality of load power meters 340.

In step 30A, the EMS 200 determines that the remaining time of a predetermined period is 15 minutes.

In step 40, the EMS 200 instructs each of the plurality of load power meters 340 to change the measurement interval of the power consumption of a load and the report interval of the consumption power. It should be noted that in this case, the EMS 200 instructs shortening of the measurement interval of the power consumption of a load and the report interval of the power consumption.

Thereby, as shown in step 20A, the report interval of the amount of power consumption is shortened from the interval T1 to the interval T2.

In a case shown in FIG. 10, in step 30B, the EMS 200 determines that the remaining time of a predetermined period is 10 minutes. Here, the EMS 200 does not instruct, again, a change of the measurement interval and the report interval; however, as shown in step 20B, the report interval of the amount of power consumption is shortened from the interval T2 to an interval T3. That is, each load power meter 340 may autonomously shorten the report interval of the amount of power consumption, in response to an instruction in step 40. However, the embodiment is not limited thereto; the EMS 200 may instruct, again, a change of the measurement interval and the report interval.

Although omitted in the case shown in FIG. 10, when it is determined that the remaining time of a predetermined period is 5 minutes, the report interval of the amount of power consumption may be shortened to an interval shorter than the interval T3.

(Third Control Example of Acquisition Function)

Figure 11:
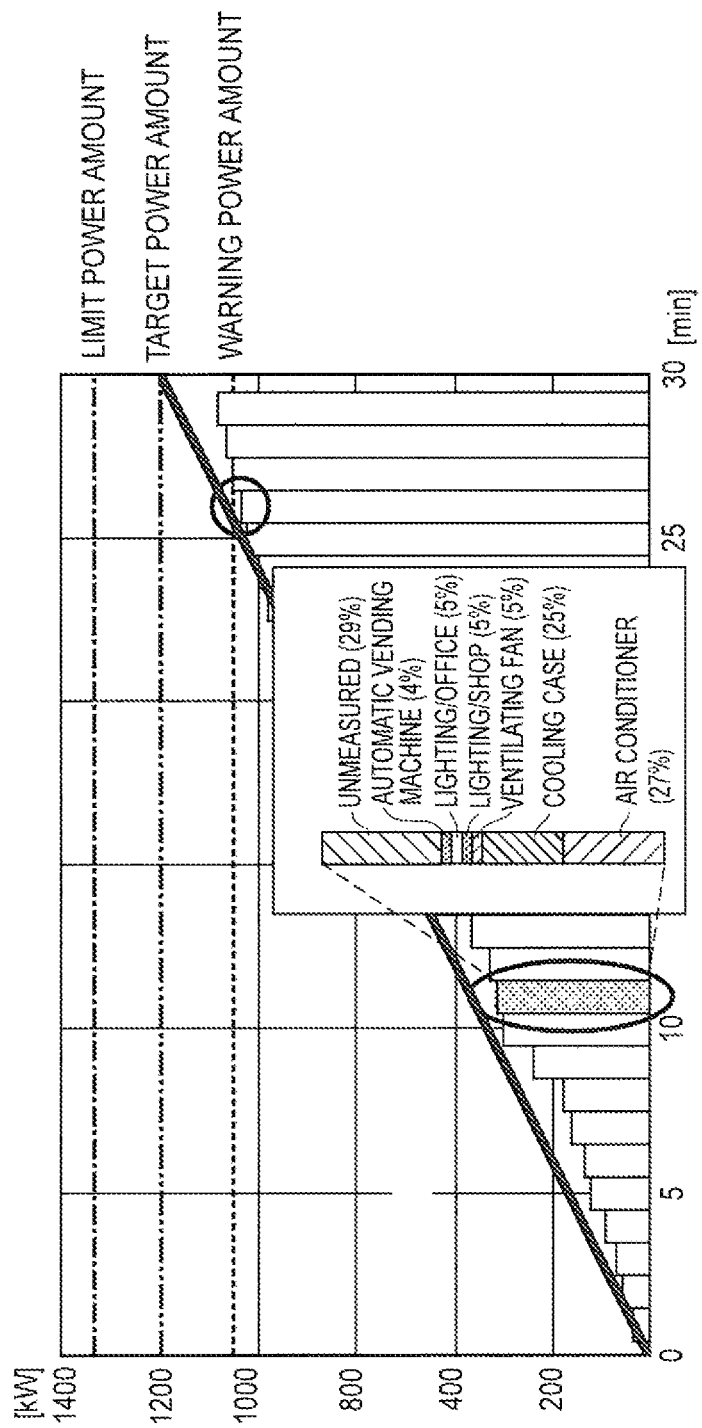
FIG. 11 is a diagram showing an overview of a third control example of the acquisition function according to the first embodiment.
Figure 12:
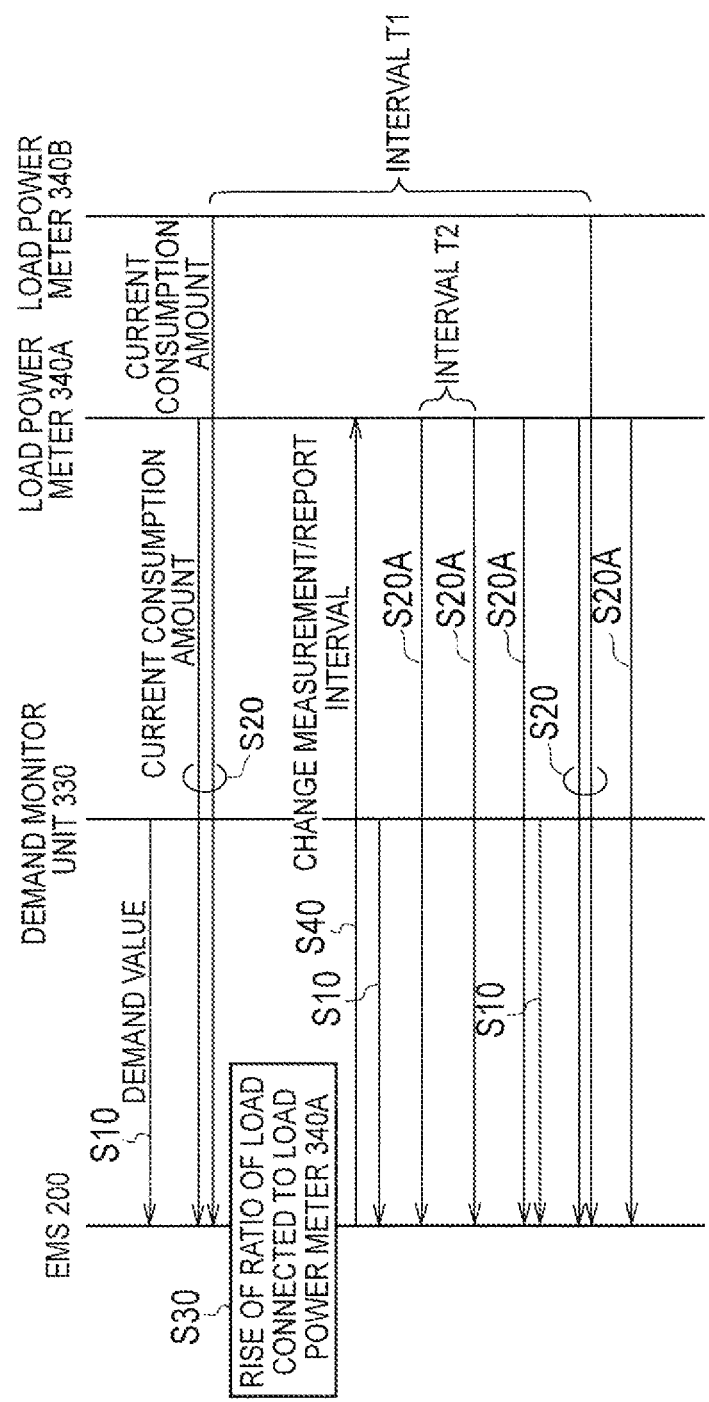
FIG. 12 is a diagram showing a sequence of the third control example of the acquisition function according to the first embodiment.

A third control example of the acquisition function according to the first embodiment will be described, below. FIG. 11 is a diagram showing an overview of the third control example of the acquisition function according to the first embodiment. FIG. 12 is a diagram showing a sequence of the third control example of the acquisition function according to the first embodiment.

As shown in FIG. 11, the control unit 230 activates the function of acquiring the amount of power consumption of a load, for the load having an amount of power consumption that has a ratio relative to the integral power consumption exceeding a predetermined ratio, out of a plurality of loads.

As shown in FIG. 12, in step 10, the EMS 200 cyclically receives the integral power consumption (demand value) from the demand monitor unit 330.

In step 20, the EMS 200 cyclically receives the amount of power consumption of a load from each of the plurality of load power meters 340.

In step 30, the EMS 200 determines that the ratio of the amount of power consumption of a load (for example, air conditioner) connected to the load power meter 340A relative to the integral power consumption exceeds a predetermined ratio.

In step 40, the EMS 200 instructs the load power meter 340A to change the measurement interval of the power consumption of a load and the report interval of the power consumption. It should be noted that in this case, the EMS 200 instructs shortening of the measurement interval of the power consumption of a load and the report interval of the power consumption.

Thereby, as shown in step 20A, the report interval of the amount of power consumption is shortened from the interval T1 to the interval T2.

Although not particularly described in the case shown in FIG. 12, the EMS 200 may extend the measurement interval and the report interval of the amount of power consumption, when the ratio of the amount of power consumption of a load (for example, an air conditioner) connected to the load power meter 340A relative to the integral power consumption falls below a predetermined ratio.

In the first control example to the third control example of the acquisition function, as the activation of the acquisition function, shortening of the measurement interval and the report interval of the amount of power consumption is described as an example. However, the embodiment is not limited thereto. The activation of the acquisition function may be a start of measuring the amount of power consumption and a start of reporting the power consumption.

As described above, in the embodiment, the control unit 230 activates an acquisition function when it is determined at each time point in a predetermined period that an integral power consumption exceeds a predetermined power consumption. That is, when it is necessary to acquire the amount of power consumption of a load, the acquisition function is activated. Therefore, the amount of power consumption that is necessary for acquiring an amount of power consumption of a load is restrained while appropriately acquiring the amount of power consumption of the load.

In the embodiment, the control unit 230 activates the acquisition function after a predetermined timing in a predetermined period. That is, when it is necessary to acquire the amount of power consumption of a load, the acquisition function is activated. Therefore, the amount of power consumption that is necessary for acquiring an amount of power consumption of a load is restrained while appropriately acquiring the amount of power consumption of the load.

In the embodiment, the control unit 230 activates the acquisition function, for a load having an amount of power consumption that has a ratio relative to the integral power consumption exceeding a predetermined ratio, out of a plurality of loads. That is, the acquisition function is activated only in the load in which the power needs to be consumed. Therefore, the amount of power consumption that is necessary for acquiring an amount of power consumption of a load is restrained while appropriately acquiring the amount of power consumption of the load.

Other Embodiments

Although the present invention has been described with reference to the embodiment described above, it should not be understood that the discussion and drawings constituting a part of the disclosure are limiting the present invention. Various alternative embodiments, examples and operation technology will be apparent to a person skilled in the art from the present disclosure.

In the embodiment, the power management apparatus is the EMS 200. However, the embodiment is not limited thereto. The power management apparatus may be configured by the demand monitor unit 330. Alternatively, the power management apparatus may be arranged in the CEMS 20, and may be arranged in the smart server 40. Alternatively, the power management apparatus may be arranged in HEMS (Home Energy Management System), may be arranged in BEMS (Building Energy Management System), may be arranged in FEMS (Factory Energy Management System), and may be arranged in SEMS (Store Energy Management System).

Although not particularly described in the embodiment, the load power meter 340 may be a current sensor, for example.

In the embodiment, the consumer's facility 10 includes the load 120, the PV unit 130, the storage battery unit 140, the fuel cell unit 150, and the hot-water storage unit 160. However, it may suffice that the consumer's facility 10 includes at least the load 120.

Although not particularly described in the embodiment, the presented information 400 may include PV-power-generation prediction information. Alternatively, the presented information 400 may include information indicating power generation surplus of the fuel cell 151. Alternatively, the presented information 400 may include a residual power amount of the fuel cell 151.

Although not particularly described in the embodiment, the EMS 200 preferably controls the PV unit 130, the storage battery unit 140, the fuel cell unit 150, and the hot-water storage unit 160 so that the integral power consumption at the expiration timing of a predetermined period does not exceed a predetermined power consumption.

Although not particularly described in the embodiment, in the activation of the acquisition function, only the measurement interval of the amount of power consumption may be shortened while not changing the report interval of the power consumption. Likewise, in the deactivation of the acquisition function, only the measurement interval of the amount of power consumption may be extended while not changing the report interval of the power consumption.

Although not particularly described in the embodiment, the basic rate is determined, for example, on the basis of the power amount in the past predetermined period (for example, 30 minutes). That is, by the grid power meter 310, the power amount (amount of power consumption) for 30 minutes is measured. Then, an average power consumption (kW) in the 30 minutes is calculated. This average power consumption is called 30-minute demand value. Then, the maximum 30-minute demand value in a month is called a maximum demand power (maximum demand value) of the subject month. Then, the maximum demand value of the subject month, or the largest value of the maximum demand values in the past one year period, is used for calculation of the basic rate. That is, if even one large demand value occurs in one month or one year, the basic rate using that demand value is to be applied for the next month or over the next year. Thus, the basic rate is determined.

It is noted that the entire content of Japan Patent Application No. 2012-153830 (filed on Jul. 9, 2012) is incorporated in the present application by reference.

INDUSTRIAL APPLICABILITY

According to the present invention, it is possible to provide a power management apparatus capable of restraining an amount of power consumption necessary for acquiring an amount of power consumption of a load while appropriately acquiring the amount of power consumption of a load, and to provide a power management method therefor.

The invention claimed is:

1. A power management apparatus comprising:
a control unit configured to perform a control so that an integral power amount does not exceed a predetermined power amount, the integral power amount being an integrated value of values measured by a grid power meter that measures power supplied from a grid in a predetermined period, and
an acquisition unit configured to acquire a consumption power amount, the consumption power amount being a value measured by a load power meter that measures power consumed by a load connected to the grid, wherein
the control unit configured to control an acquisition function of the consumption power amount, and
the control unit configured to activate the acquisition function when it is determined at each time point in the predetermined period that the integral power amount exceeds the predetermined power amount, and deactivate the acquisition function when it is determined at each time point in the predetermined period that the integral power amount falls below the predetermined power amount.

2. The power management apparatus according to claim 1, wherein the activation of the acquisition function is one of an operation of starting acquiring the consumption power amount and an operation of shortening an interval of acquiring the consumption power amount.

3. The power management apparatus according to claim 1, wherein the deactivation of the acquisition function is one of an operation of stopping acquiring the consumption power amount and an operation of extending an interval of acquiring the consumption power amount.

4. The power management apparatus according to claim 1, wherein the control unit is further configured to activate the acquisition function at a timing after a predetermined timing during the predetermined period.

5. The power management apparatus according to claim 1, wherein the control unit is further configured to activate the acquisition function for a load which has a ratio of consumption power amount to the integral power amount that exceeds a predetermined ratio.

6. A power management method comprising a step of:
(a) performing a control so that an integral power amount does not exceed a predetermined power amount, the integral power amount being an integrated value of values measured by a grid power meter that measures power supplied from a grid in a predetermined period, and
(b) acquiring a consumption power amount, the consumption power amount being a value measured by a load power meter that measures power consumed by a load connected to the grid, wherein
the step (a) includes a step of controlling an acquisition function of the consumption power amount,
the step (a) includes a step of activating the acquisition function when it is determined at each time point in the predetermined period that the integral power amount exceeds the predetermined power amount, and
the step (a) includes a step of deactivating the acquisition function when it is determined at each time point in the predetermined period that the integral power amount falls below the predetermined power amount.

7. The power management method according to claim 6, wherein the step (a) includes a step of activating the acquisition function at a timing after a predetermined timing during the predetermined period.

8. The power management method according to claim 6, wherein the step (a) includes a step of activating the acquisition function for a load which has a ratio of consumption power amount to the integral power amount that exceeds a predetermined ratio.

* * * * *